May 28, 1963 N. J. HARRICK Re. 25,389
SEMICONDUCTOR STEPPING SWITCH
Original Filed March 1, 1960
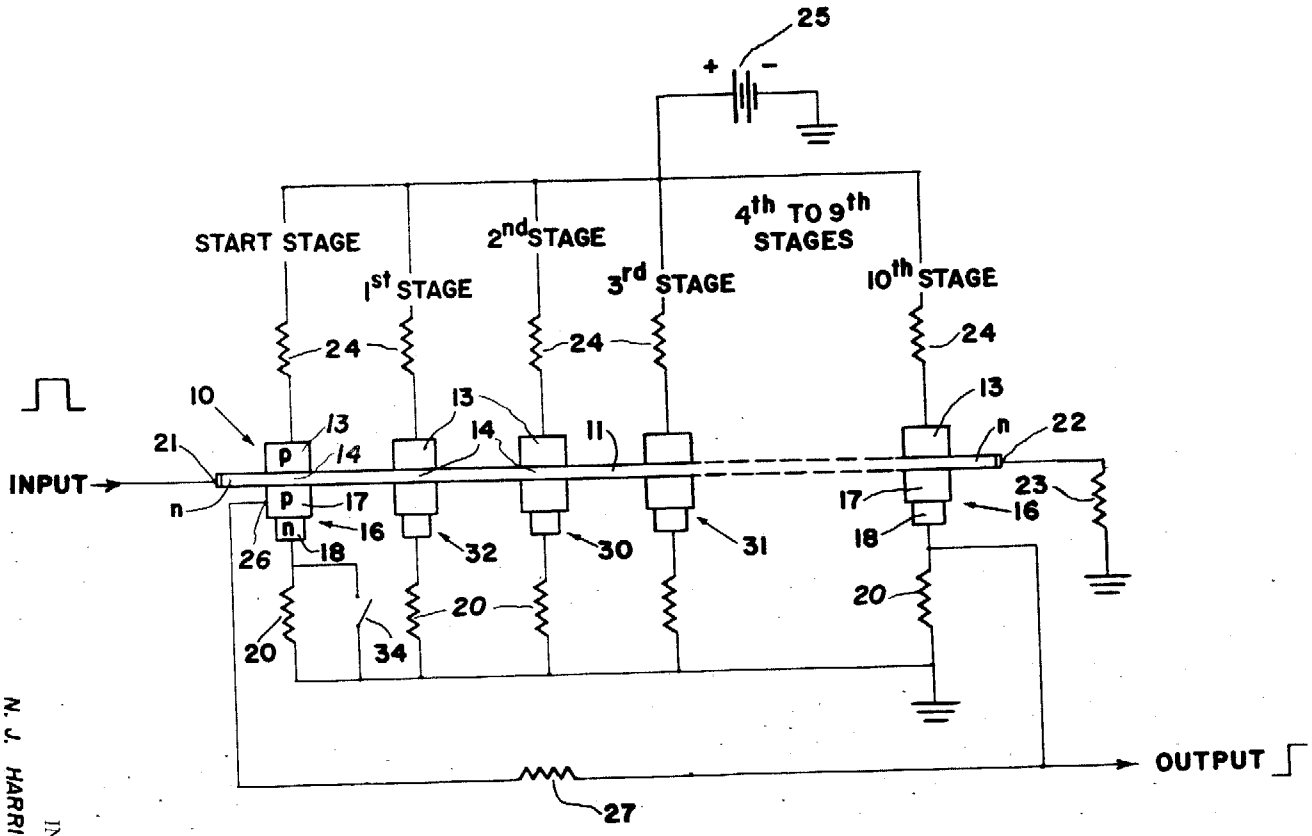
INVENTOR.
N. J. HARRICK
BY
Frank R. Trifari
AGENT United States Patent Office Re. 25,389
Reissued May 28, 1963

25,389

SEMICONDUCTOR STEPPING SWITCH

Nicolas J. Harrick, Ossining, N.Y., assignor to North American Philips Company, Inc., New York, N.Y., a corporation of Delaware Original No. 3,033,993, dated May 8, 1962, Ser. No. 12,094, Mar. 1, 1960. Application for reissue Sept. 24, 1962, Ser. No. 226,776
5 Claims. (Cl. 307—88.5)

Matter enclosed in heavy brackets [ ] appears in the original patent but forms no part of this reissue specification; matter printed in italics indicates the additions made by reissue.

This invention relates to a semiconductor stepping switch, the semiconductor analogy of the gas-stepping tube.

A semiconductor stepping switch known as a stepping transistor has been described in the art. It comprises a series of four-layer diode stages constructed with a common base and emitter region. Each of these four-layer diode stages possesses a negative resistance and is characterized by two stable conditions, an Off condition in which the current through the four layers is at a very low value of the order of the usual reverse or leakage current of a pn junction, and an On condition in which a very large current flows through the four layers. These diodes can be switched from the Off to the On condition by various techniques, among which are the application of a voltage across the four layers exceeding the breakdown voltage or the injection into the base region of a suitable number of free charge carriers. The diode can be switched back to the Off condition by removing the applied voltage, or reducing its current below the minimum sustaining value.

In the known stepping transistor, the various stages are connected through a common series resistor to a suitable source of potential, which has the effect, similar to the gas tube circuit, that the establishment of current in any one of the four-layer diode stages reduces the voltage applied to the other stages and prevents them from becoming conductive. Therefore, such a device possesses stable operation in which any one of the series of stages may be switched into the On condition and the others would be maintained in the Off condition. By transferring this On condition successively through the stages, scaler operation is achieved, in which each input signal pulse transfers the On condition from stage to stage until the last stage is reached, whereupon an output pulse may be derived, which is a sub-multiple of the number of input pulses.

The main problem of these devices, which is also found in the gas-tube analog, is to ensure that the On conditions are transferred from stage to stage in a single predetermined direction only. In the known device, this is assured by an asymmetrical geometry of the regions defining the reversed bias junction of the diode (hook collector), so that the conduction in a particular stage in the On condition is closer to the next adjacent stage on one side than to the adjacent stage on its opposite side, so that the conduction of the selected stage so-to-speak primes the following stage for conduction. This device suffers from the obvious drawback that it is far simpler to make a symmetrical geometry than a non-symmetrical geometry as would be required. In addition, the circuitry for this known device requires a switching input circuit whereby the input pulses are applied alternately to the odd and even numbered stages, which complicates, and unnecessarily increases the cost of, the circuitry required for this device.

The main object of the invention is the provision of a semiconductor stepping switch employing a novel technique for assuring transfer of the internal conduction in a predetermined direction in the device.

A further object of the invention is to provide a semiconductor stepping device employing a symmetrical geometry.

A still further object of the invention is the provision of a semiconductor stepping switch in which a switching circuit for applying the input pulses is unnecessary.

The desired results of the invention are achieved with a stepping switch construction in which the input pulses are applied to the common base region of the device in such a manner that they function not only to turn off the conducting region but in addition to transport the charge carriers existing at that conducting region to the next adjacent stage in a predetermined direction, so that when the input pulse terminates and conducting potentials are again applied to the device, only that next adjacent stage in the desired direction will become conductive.

The invention will now be explained in greater detail with reference to the accompanying drawing, in which the sole FIGURE illustrates one form of switching device in accordance with the invention provided in a suitable operating circuit.

Referring now to the drawing, there is shown therein a stepping transistor 10 suitable for use in the inventive switch. The transistor 10 comprises an elongated bar 11 of suitable semiconductive material, such as, for example, silicon, of n-type conductivity. At the top surface of the bar 11 are provided plural, spaced, p-type conductivity regions 13 forming plural p-n junctions with the bar and plural adjacent p-type emitter 13 and n-type base 14 regions. At the bottom side of the semiconductive bar 11 are provided a series of spaced hook collectors 16, each comprising contiguous p-type 17 and n-type 18 zones defining between them a pn junction, with the p-type zones 17 forming pn junctions with the elongated base region 14. There is thus formed a series of four-layer diode (or triode) stages or stepping transistor with a common base region 14. Ohmic connections are made to the n-regions 18 of the hook collectors 16, and to each of these ohmic connections is coupled a resistor 20. The ends of all of the resistors 20 are tied together to a common ground point. Ohmic contacts 21 and 22 are provided at opposite ends of the elongated bar 11. The *right* [left]-hand contact [21] *22* is grounded through a resistor 23. The *left* [right]-hand contact [22] *21* represents the input terminal to the device and to it are applied the pulses to be counted or scaled downward. An ohmic contact is also made to the top of each of the p-emitter regions 13, and to each contact is connected a resistor 24, which in turn are all connected to a suitable source 25 of positive potential. An ohmic contact 26 is made to the p-region 17 of the hook collector 16 of the leftmost or start stage at the left-hand end of the bar. That contact 26 is coupled via a decoupling resistor 27 to the end collector region 18 of the final or tenth stage at the right-hand end of the bar. The output signals are also derived from that point, as shown in the drawing. For a decade scaler, a start stage plus ten counting stages are provided. The fourth through ninth stages, which have not been shown for clarity's sake, are identical to the first, second, and third stages.

The circuit shown operates in the following manner. As noted before, each of the four-layer diode stages exhibits a high impedance Off condition with very little current flow, and a low impedance On condition capable of sustaining very high current flow. Assume now that the second stage 30 is in its On condition. This means that there is a large flow of current from the battery 25 through its series resistor 24, through the four semiconductive regions of the second stage 30, through the resistor 20 and thus back to the potential source. This conduction condition is [table] *stable* and is self-sustaining, once accomplished. The values of the resistors 20 and 24, and the potential source 25 are chosen so that the actual potential appearing directly across each of the four-layer stages is below is breakdown voltage, and thus all the other stages remain in the Off condition. What is now required is that the application of a pulse to the device will cause the On condition in the second stage to be transferred to the third stage 31 on its right only and never to the *first* [second] stage 32 on its left. In short, the On condition must always be transferred in the same predetermined direction through the device. This is accomplished in the switch of the invention in the following manner. As will be noticed, the emitter-base junction of the second stage in its On state is biased in the forward direction. It is possible to turn off these four-layer diodes by reverse biasing that junction. This function is performed by the input pulse, which must, for the pnpn geometry shown, be in the *positive* [negative]-going direction as illustrated. The effect of the application of a *positive* [negative]-going input pulse to the contact [22] *21*, the other end of the bar being grounded through a resistor 23, is to establish a voltage gradient along the length of the base region 14, with the right-hand end being more negative than the left end. The input pulse is adjusted to have a magnitude such that the value of *positive* [negative] potential thus established in the base region of all of the stages in sufficient to switch any or all of them to the Off condition. Thus, the first function performed by the input pulses is to turn off the conducting stage and also maintain the other stages in the Off condition. The second function performed by the input pulses is to transfer the conditions for conduction from the stage where last they existed to the next following stage in the proper direction. This is accomplished as follows. In the conduction condition of this second stage, for example, with the flow of high currents through the four regions constituting the second stage, the base region of that stage becomes flooded with minority-charge carriers, which for the geometry illustrated, are positive holes. When the voltage gradient is established in the base region 14 by the application of an input pulse, these positive holes are attracted toward the negative end of the bar by the electric field thereby established. Consequently, they are transported or drifted along the common base region 14 toward the right. By suitable adjustment of the duration of the input pulse, these minority-charge carriers can be transferred to the base region of the third stage 31. At that point, the input pulse terminates, and, because of the absence of current flow through the device, the full potential of the battery 25 is applied across all of the four-layer stages. When this occurs, it will be found that the third stage only will become conducting while the remaining stages will remain non-conducting. This is because the third stage alone has in its base region a multiplicity of free-charge carriers, which is the necessary condition to turn it on. It will be seen from the foregoing that the application of successive pulses will cause the On condition to be transported to the right from stage to stage until the final or tenth stage at the right-hand end of the bar is reached.

When the tenth stage becomes conducting after the tenth pulse has terminated, a positive-going voltage step or pulse appears across its series resistor 20. This positive-going step represents the output of the device, which can be used now to trigger on the next scaler circuit, which, if of the same type as illustrated, would have to have the *same* [opposite] polarity, namely, [npnp]*pnpn*, or the step itself may be amplified and inverted. That same output pulse is also coupled to p-region 17 of the start stage. Applying a positive pulse to that region causes carrier injection into the adjacent base region 14, which thus turns on the start stage. Thus, both the tenth and start stages are now conducting. When the eleventh pulse enters, it, as usual, turns off all of the stages, and also drifts the carriers from the conducting regions to the right. Those carriers drifted from the tenth stage are collected at the ohmic contact 22. The carriers at the start stage are drifted to the first stage, so that when the eleventh pulse terminates, that first stage will become conducting, and the device has thus been recycled.

To start operation, it is merely necessary to turn on the start stage, whereby the first-received pulse will turn on the first stage. This may be done in various ways. For simplicity, it has been accomplished by a push-button switch 34 which momentarily short-circuits the series resistor 20, which raises the potential applied across the four-layer diode above its breakdown value, and it is turned on.

It will be observed that the switch has been recycled through the use of an additional start stage. This is not essential in the invention, and it can be eliminated by including a common series resistor between the potential source 25 and all of the series resistors 24. Next, the resistors 24 and 20 in the first stage have to be adjusted, by reducing their values relative to the values of their counterparts in the other stages, such that the resultant potential appearing directly across the first four-layer diode is sufficient to turn it on, provided that no other stage is conducting. If another stage is conducting, then the voltage drop across the common resistor will reduce the potential below that value needed to turn on the first stage. But if no other stage is conducting, then the first stage will automatically be turned on. Thus, when the tenth stage has been conducting and the eleventh pulse is applied, all the stages are turned off and the carriers in the tenth stage are collected. When the eleventh pulse terminates, no free carriers exist anywhere in the base region 14, and automatically the first stage will become conductive thereby indicating the counting of the eleventh pulse.

The device illustrated can be manufactured in many different ways by techniques well known in the semi-conductor art. As one suitable method, the bar 11 can represent an elongated strip-shaped wafer of n-type silicon with a resistivity of about 50 ohm-cm. To the top surface can be alloyed eleven dots of aluminum to produce p-type emitter regions in the bar. The p-regions of the hook collector can be formed by solid-state diffusion, by masking off the bottom surface leaving exposed silicon areas underneath the emitters 13, and then heating the bar in the presence of boron vapor, which will diffuse into the n-type bar and produce p-type regions. Thereafter, lead-arsenic or antimony dots can be alloyed to these p-type regions 17 to form the n-zone of the collector. The temperatures required for these alloying and diffusion operations will determine their order of processing. The ohmic contacts at the ends can be applied by soldering nickel strips to the bar ends employing a tin-antimony solder. The various resistances employed are chosen on the basis of well-known principles. The resistors 23 and 27 should have relatively low values, of the order of 100 ohms. The resistors 20 and 24 may have values of the order of 1000 ohms. The potential source 25 may be about 50 volts. For suitable operation, the input pulse may have a magnitude of about 100 volts, and for a stage spacing of 1 millimeter, a duration of about 3 microseconds. For faster counting, the dimensions should be reduced, or higher mobility materials used, such as a p-type base region with silicon, or indium antimonide.

While I have described my invention in connection with specific embodiments and applications, other modifications thereof will be readily apparent to those skilled in this art without departing from the spirit and scope of the invention as defined in the appended claims.

What is claimed is:

1. A semiconductor stepping switch comprising an elongated semi-conductive body and a plurality of successively-arranged bistable switching elements on said body having the body in common as a base region, each of said switching elements having separate emitter and collector regions arranged at opposite sides of the base region, contacts to spaced points of the body and defining between them a line passing through the successive switching elements, each of said switching elements exhibiting the property of becoming conductive when free charge carriers are provided within its base region, and means for applying input pulses to the contacts connected to the body of such a polarity as to render non-conductive all of the switching elements and to establish a drift field along the body capable of transporting charge carriers in a predetermined direction through the body to the vicinity of one of the elements.

2. A semiconductor stepping switch comprising an elongated semi-conductive body and a plurality of in-line successively-arranged bistable switching elements on said body having the body in common as a base region, each of said switching elements having separate emitter and collector regions arranged at opposite sides of the base region, contacts to spaced points at opposite ends of the body and in line with the switching elements, means for applying potentials across said switching elements whereby they are rendered conductive when free charge carriers are provided within their base region, they generate carriers when they are conductive, and they are rendered non-conductive when a voltage of predetermined polarity and value is established within their base region, and means for applying input pulses to the contacts connected to the body of such a polarity and magnitude as to render non-conductive all of the switching elements and to establish a drift field along the body capable of transporting charge carriers wherever present in the body in a predetermined direction through the body to the vicinity of the base region of one of the elements.

3. A semiconductor stepping switch comprising an elongated semi-conductive body and a plurality of in-line successively arranged bistable four-layer switching elements on said body having the body in common as a base region, each of said switching elements having separate emitter and collector regions arranged at opposite sides of the base region, each of said four-layer elements possessing an Off condition with negligible current flow, and [on] *an* On condition with relatively high current flow, and being switchable into the On condition when suitable potenials are applied thereto by establishing free charge carriers in its base region, and being switchable to the Off condition by applying a predetermined voltage to its base region, contacts to spaced points of the body and in line with the successive switching elements, means for applying potentials across the switching elements whereby they remain in the Off condition unless free charge carriers are provided within their base regions, and means for applying input pulses to the contacts connected to the body of such a polarity as to establish said predetermined voltage in the base regions of all of the elements and thus switch them all to the Off condition and to establish a drift field along the body capable of transporting any charge carriers in the base region of one of the elements in a predetermined direction through the body to the vicinity of the next adjacent element.

4. A semiconductor stepping switch comprising an elongated semi-conductive body and a plurality of in-line successively-arranged bistable four-layer switching elements on said body having the body in common as a base region, each of said switching elements having separate emitter and collector regions arranged at opposite sides of the base region, each of said four-layer elements possessing an Off condition with negligible current flow, and an On condition with relatively high current flow, and being switchable into the On condition when suitable potentials are applied thereto by establishing free charge carriers in its base region, and being switchable to the Off condition by applying a predetermined voltage to its base region, ohmic contacts to opposite points of the body and in line with the successive switching element, means for applying potentials across the switching elements whereby they remain in the Off condition unless free charge carriers are provided within their base regions, means for switching one of the elements into the On condition, and means for applying an input pulse to the contacts connected to the body of such a polarity as to establish said predetermined voltage in the base regions of all of the elements and thus switch them all to the Off condition and to establish a drift field along the body capable of transporting charge carriers in the base region of said one element in a predetermined direction through the body to the vicinity of the next adjacent element, whereby when the input pulse terminates, only that next adjacent element is switched into the On condition.

5. A switch as set forth in claim 4 wherein each four-layer switching element comprises alternate p- and n-type conductivity regions.

References Cited in the file of this patent or the original patent

UNITED STATES PATENTS

| | | |
|---|---|---|
| 2,856,544 | Ross | Oct. 14, 1958 |
| 2,922,898 | Henisch | Jan. 26, 1960 |
| 2,941,092 | Harrick | June 14, 1960 |
| 2,967,952 | Shockley | Jan. 10, 1961 |